United States Patent
Acharya et al.

(10) Patent No.: US 6,847,581 B2
(45) Date of Patent: Jan. 25, 2005

(54) INTEGRATED CIRCUIT AND METHOD FOR OPERATING THE INTEGRATED CIRCUIT

(75) Inventors: Pramod Acharya, München (DE); Peter Schrögmeier, München (DE); Stefan Dietrich, Türkenfeld (DE); Christian Weis, Germering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/340,989

(22) Filed: Jan. 13, 2003

(65) Prior Publication Data

US 2003/0132792 A1 Jul. 17, 2003

(30) Foreign Application Priority Data

Jan. 11, 2002  (DE) ......................................... 102 00 898

(51) Int. Cl.[7] ............................................. G11C 29/00
(52) U.S. Cl. ....................... 365/233; 365/201; 327/407
(58) Field of Search ................................. 365/233, 201, 365/189.05, 189.07, 189; 327/99, 407, 122

(56) References Cited

U.S. PATENT DOCUMENTS

| | | | | |
|---|---|---|---|---|
| 5,202,626 A | * | 4/1993 | Pham et al. ............. | 324/158 R |
| 5,321,734 A | * | 6/1994 | Ogata .......................... | 377/47 |
| 5,355,097 A | * | 10/1994 | Scott et al. .................. | 331/1 A |
| 5,453,993 A | * | 9/1995 | Kitaguchi et al. .......... | 432/73.1 |
| 5,864,246 A | | 1/1999 | Anderson ..................... | 327/122 |
| 6,216,254 B1 | * | 4/2001 | Pesce et al. ................... | 716/5 |
| 6,275,444 B1 | * | 8/2001 | Nakano et al. .............. | 365/233 |
| 6,400,188 B1 | * | 6/2002 | Baket et al. .................. | 327/99 |
| 6,452,849 B1 | * | 9/2002 | Iwamoto ...................... | 365/201 |

FOREIGN PATENT DOCUMENTS

| | | |
|---|---|---|
| DE | 197 30 806 A1 | 1/1999 |
| EP | 0 785 624 A1 | 7/1997 |

* cited by examiner

*Primary Examiner*—Dinh T. Le
(74) *Attorney, Agent, or Firm*—Laurence A. Greenberg; Werner H. Stemer; Ralph E. Locher

(57) ABSTRACT

An integrated circuit includes a processing circuit with at least one first and second input connected to a connection for obtaining a control clock. The first and second input are for receiving at least one first and second clock signal that each are derived from the control clock and that are shifted in phase with respect to one another. A third clock signal is generated from the first and second clock signals, and is at a higher frequency than the frequency of the control clock for controlling operation of the circuit. The third clock signal is output at an output. Since the frequency of the third clock signal is greater than the frequency of the control clock, the circuit can, however, be operated over its full frequency range, by using a test unit to supply a control clock at a lower frequency.

8 Claims, 2 Drawing Sheets

NORMAL MODE

TEST MODE

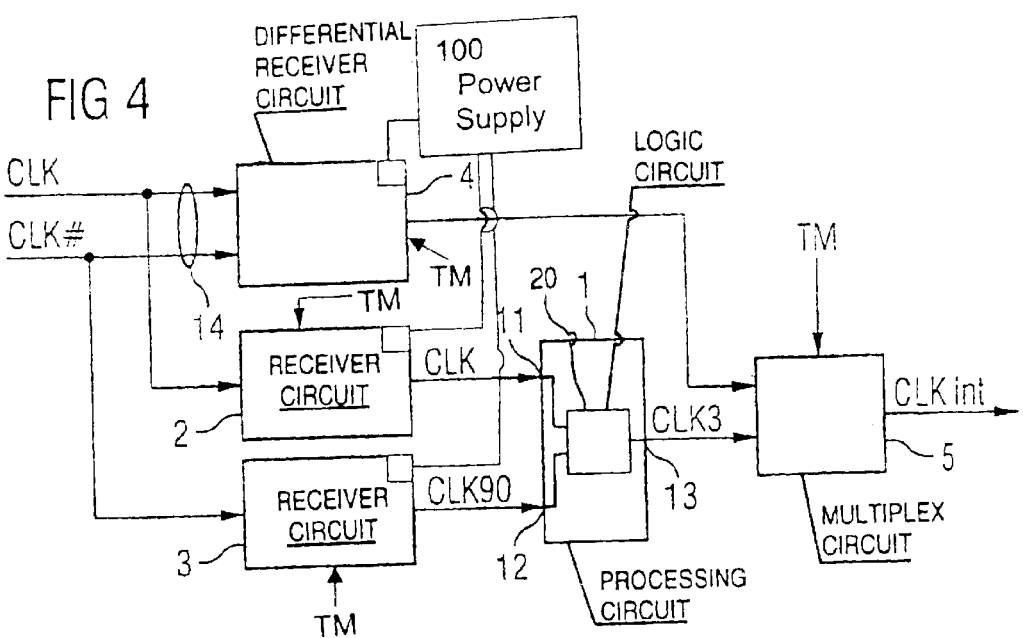
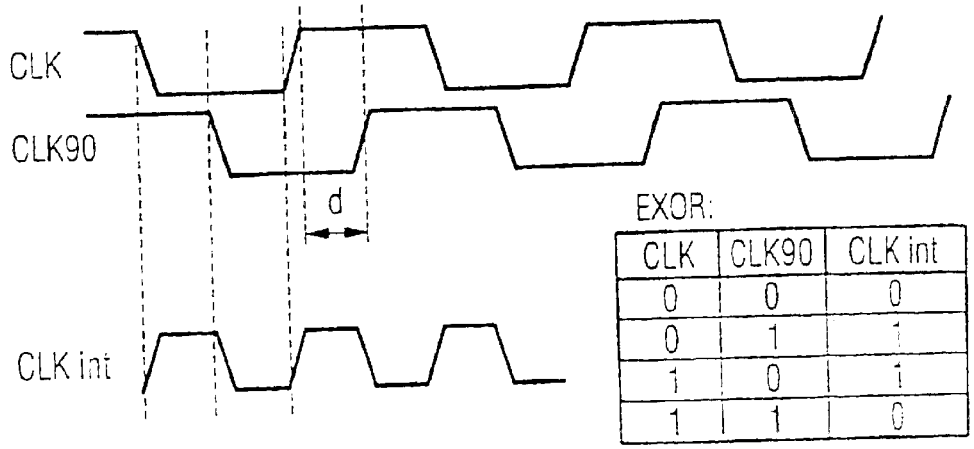

INTEGRATED CIRCUIT AND METHOD FOR OPERATING THE INTEGRATED CIRCUIT

BACKGROUND OF THE INVENTION

Field of the Invention

The present invention relates to an integrated circuit and a method for operating the integrated circuit.

The operating frequency, with which an integrated circuit is operated, is generally continuing to increase as developments progress in the area of integrated circuits. As the operating frequencies of integrated circuits become increasingly higher, it is usually more and more difficult to test the functional capability of these integrated circuits. In this respect, in order to obtain a largely meaningful test result, it is important that the integrated circuit is also tested at the operating frequency that it has in normal operation.

From experience, it is generally a significant problem to make test units available, which are appropriate for testing integrated circuits with a high operating frequency and which are able to provide input clock signals for an integrated circuit that will be tested at a frequency corresponding to the operating frequency of the integrated circuit in normal operation. Furthermore, the input clock signals should have a sufficiently high accuracy.

SUMMARY OF THE INVENTION

It is accordingly an object of the invention to provide an integrated circuit such that particularly in a test mode, it is possible to operate the circuit over a full frequency range while supplying a control clock, which has a lower frequency than the maximum frequency of the frequency range, to the integrated circuit.

It is accordingly also an object of the invention to provide a method for operating an integrated circuit of this kind.

With the foregoing and other objects in view there is provided, in accordance with the invention, an integrated circuit including: a connection for obtaining an externally applied control clock; and a processing circuit having an output, and at least a first input and a second input. The first input is connected to the connection for receiving at least a first control clock signal derived from the control clock. The second input is connected to the connection for receiving at least a second control clock signal derived from the control clock. The first control clock signal and the second control clock signal are shifted in phase with respect to one another. The output is for outputting a third clock signal generated from the first clock signal and the second clock signal. The third clock signal is at a higher frequency than a frequency of the control clock, which is used for controlling an operating mode of the integrated circuit. The processing circuit is activated in a test mode of the integrated circuit for testing a functional capability of the integrated circuit. The third clock signal is for controlling the integrated circuit in the test mode. The processing circuit is deactivated during normal operation of the integrated circuit. The connection is also for obtaining a further control clock for controlling the integrated circuit during the normal operation.

For so-called high-performance components, whose operating frequency in normal operation is greater than the maximum frequency of a test unit used for a test mode, the invention provides a capability for testing such components over their full frequency range. In general, test units with a wide frequency range are very expensive and often have a long delivery time, which can represent a critical delay factor when marketing a new product. The invention therefore provides a capability for testing a newly developed high-performance component without purchasing a new test unit and thus saves costs. Furthermore, this allows the product to come onto the market earlier.

In principle, the invention is applicable to all integrated circuits that have a connection for supplying an external control clock for controlling operation of the integrated circuit. Preferably, the invention can be used in all DRAM (Dynamic Random Access Memory) memory circuits, in particular with differential control clock inputs. Preferably, the first and the second clock signal supplied to the processing circuit are each generated from a clock signal at differential control clock inputs. However, in principle, it is also possible to generate the first and/or second clock signal from only one clock signal of a control clock by the intermediate connection of appropriate converter circuits.

For operating the integrated circuit, in a first mode, in particular, in a normal mode of the integrated circuit, a first control clock at a first frequency is applied to the connection for the control clock and the integrated circuit is controlled by the first control clock. In a second mode, in particular, in a test mode of the integrated circuit, a second control clock at a second frequency, which is lower than the first frequency of the first control clock in normal mode, is applied to the connection for the control clock. In the test mode, the integrated circuit is controlled by the third clock signal generated by the processing circuit. Since the frequency of the third clock signal is greater than the frequency of the second control clock, the circuit can be operated over its full frequency range in spite of a control clock being supplied at a lower frequency using the test unit.

The processing circuit is deactivated during normal operation of the integrated circuit. In normal operation, the integrated circuit is controlled by the control clock. In the test mode, in which the functional capability of the integrated circuit is tested, the processing circuit is activated, and the circuit in this mode is controlled by the third clock signal.

In an improvement of the invention, the processing circuit has a logic circuit for logically combining the first and second clock signal.

In one embodiment of the integrated circuit, in the first mode of the circuit, a differential control clock is applied to the connection for the control clock. In a second mode of the circuit, a control clock with two control clock signals, which are not inverted with respect to one another, is applied to the connection for the control clock, for supplying the first and second input of the processing circuit. In particular, in this mode, the first and second input of the processing circuit each receive clock signals, which are shifted in phase with respect to one another by about 90° or by about a quarter of one period of the control clock.

With the foregoing and other objects in view there is provided, in accordance with the invention, a method for operating an integrated circuit. The method includes steps of: providing the integrated circuit described above; for controlling the integrated circuit during the normal operation of the integrated circuit, applying a first control clock at a first frequency to the connection; in the test mode of the integrated circuit, applying a second control clock at a second frequency to the connection, the second frequency being lower than the first frequency of the first control clock; and in the test mode, testing a functional capability of the integrated circuit and using the third clock signal to control the integrated circuit.

In accordance with an added mode of the invention, in the test mode, the connection is connected to a test unit that provides the second control clock.

Other features which are considered as characteristic for the invention are set forth in the appended claims.

Although the invention is illustrated and described herein as embodied in an integrated circuit and method for operating the integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is an embodiment of an inventive integrated circuit; and

FIG. 5 is a signal diagram associated with the circuit shown in FIG. 4.

DESCRIPTION OF THE PREFERRED EMBODIMENTS

Figure 1:
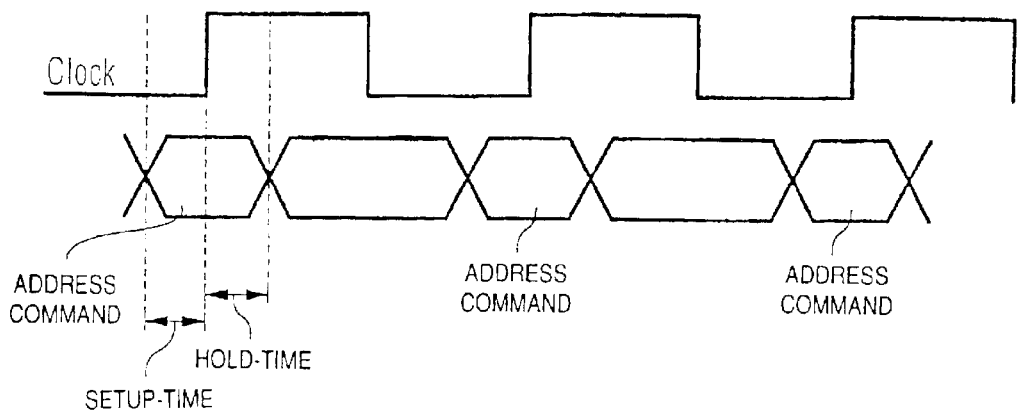
FIG. 1 is a signal diagram of a clock signal with the associated setup time and hold time.

Referring now to the figures of the drawing in detail and first, particularly, to FIG. 1 thereof, there is shown a signal diagram illustrating a relationship between a clock signal Clock and addresses or commands, which are read into an integrated circuit or are read out of the circuit. Unlike address or command signals, which are usually evaluated only with the rising edge of the clock pulse, the clock signal Clock has two critical edges per cycle. Here, a critical edge is understood to be a signal transition from "low" to "high" or vice versa, which is subject to a certain accuracy with regard to its timing. Unlike the edges of the clock pulse, for the address and command signals of the circuit, it is generally important only that they assume the correct value in the area around the rising edge of the clock pulse (so-called setup time and hold time). With high frequency circuits, in particular memory chips to the so-called DDR (Double Data Rate), DDR2 or ADT standard, the clock signal is usually provided in differential form. Up till now, it has generally been possible to provide a high frequency clock signal with sufficient edge accuracy on only a few, very expensive test units.

Figure 2:
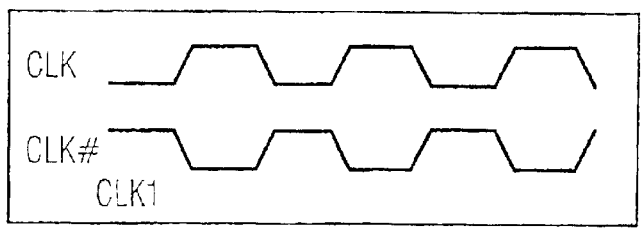
FIG. 2 is a signal diagram of a differential control clock in a normal mode of an integrated circuit.

A signal diagram of a differential control clock CLK1 with two mutually inverted clock signals CLK and CLK# is shown in FIG. 2. A control clock of this kind is supplied, for example, during normal operation of an integrated circuit with a differential clock input. A typical frequency value for a differential clock signal of this kind, in particular for high-performance DRAMs, such as, perhaps, a 128 M SGRAM, lies in a range from 300 MHz to 500 MHz. With normal test units, it is generally problematic to provide a control clock in a frequency range of this kind with a sufficient edge accuracy. A typical maximum frequency value for normal test units is about 200 MHz. Up till now, in the transition to a higher frequency range, it has generally been necessary either to acquire a new test unit, which brings with it a high reinvestment cost, or to dispense with testing the circuit at a frequency corresponding to its maximum operating frequency. This can lead to unrecognized quality problems.

Figure 3:
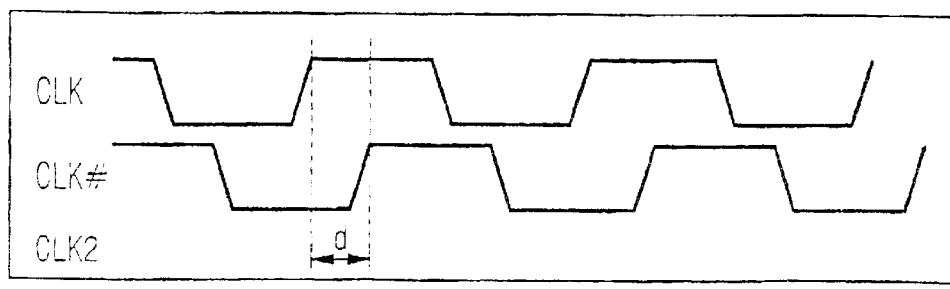
FIG. 3 is a signal diagram of a second control clock in a test mode of an integrated circuit.

FIG. 3 is a signal diagram of a control clock that is used in the invention and that is supplied to an integrated circuit in a test mode of the integrated circuit. In addition to this, a control clock CLK2, with two clock signals CLK and CLK#, is provided by a test unit, whereby, unlike normal operation of the integrated circuit, the two clock signals are not inverted with respect to one another but are shifted in phase with respect to one another by about 90 degrees or by about a quarter of one period of the control clock. At the same time, the clock signals of the control clock CLK2 provided by the test unit are at a frequency that can just be provided by the test unit so that the clock signals have sufficient edge accuracy. The clock signals of the control clock CLK1 of FIG. 2 are, for example, at a frequency of 300 to 500 MHz, while the clock signals of the control clock CLK2, for example, are at a frequency of 200 MHz. The two clock signals of the control clock CLK2 shown in FIG. 3, which are at a relatively low frequency, can be generated by the test unit with sufficient accuracy and supplied to the integrated circuit. The signals are subsequently further processed in the integrated circuit.

One embodiment of an inventive integrated circuit is shown in FIG. 4. Externally supplied clock signals CLK and CLK# are applied to a connection 14 of a differential receiver circuit 4. A first input 11 and second input 12 of a processing circuit 1 are connected to the connection 14 via receiver circuits 2 and 3 respectively. At the inputs 11 and 12 respectively, the processing circuit 1 receives a clock signal CLK and CLK90, which are derived from the clock signals CLK, CLK# respectively of the supplied control clock. The signals CLK and CLK90 are shifted in phase with respect to one another by about 90°. The processing circuit 1 generates a further clock signal CLK3 at an output 13. The further clock signal CLK3 is at a higher frequency than the clock signals CLK, CLK# of the supplied control clock. In the present exemplary embodiment, the processing circuit 1 has a logic circuit 20, which is designed as an XOR or an XNOR gate (exclusive OR gate).

As is further shown in FIG. 4, a multiplex circuit 5 is connected to the output 13 of the processing circuit 1.

Furthermore, one input of the multiplex circuit 5 is connected to the output of the differential receiver circuit 4, which makes a single clock signal available at its output. The multiplex circuit 5 can be controlled by a mode signal TM. The processing circuit 1 is deactivated during normal operation by the mode signal TM, i.e. the clock signal generated by the differential receiver circuit 4 for controlling the operation of the integrated circuit is enabled at the multiplex circuit 5. As a result, the integrated circuit is in the normal mode, and a control clock CLK1 with the clock signals CLK and CLK# (See FIG. 2), which are at the normal operating frequency of the circuit, for example, 300 to 500 MHz, is applied to the connection 14. The differential receiver circuit 4 generates a single clock signal from the differential clock signals, which controls the operation of the circuit in the form of clock signal CLKint.

In a test mode of the circuit shown in FIG. 4, the processing circuit 1, controlled by the mode signal TM, is activated. This means that the output 13 of the processing circuit 1 is enabled at the multiplex circuit 5. According to FIG. 3, clock signals CLK, CLK# of the control clock CLK2 are applied to the connection 14 via a test unit. The clock signals CLK, CLK90, which are shown in FIG. 5, appear at the outputs of receiver circuits 2 and 3.

The clock signals CLK and CLK90 are fed to the XOR gate in the processing circuit 1 as input signals. A clock signal CLK3 is produced at the output of the processing circuit 1 at a higher frequency than the clock signals CLK and CLK90. This relationship can be seen in the signal diagram shown in FIG. 5. The time d shown here corresponds to about a quarter of the period of the clock signals CLK, CLK90. The resulting clock signal CLK3 at double the frequency of the clock signals CLK, CLK90 is fed into the circuit in the form of clock signal CLKint.

In an improvement of the invention, the respective receiver circuits (receiver circuits 2 and 3 in normal mode, receiver circuit 4 in the test mode) that are not actually required for operation at that time are disconnected from a power supply by using the mode signal TM in order thus to reduce the power consumption of the whole system.

In a further exemplary embodiment of the invention, the two receiver circuits 2 and 3 can be dispensed with and chip area can thus be saved. However, in doing so, it must be ensured that a connected test unit provides the phase-shifted clock signals CLK, CLK# with the full internal voltage range and thus still guarantees sufficiently steep edges. This is necessary in order to generate an orderly clock signal CLK3 at the output of the processing circuit 1.

We claim:

1. An integrated circuit, comprising:
    a connection configured to connect to an externally applied control clock;
    a processing circuit having an output, and at least a first input and a second input;
    a first receiver circuit connected upstream from said first input, said first receiver circuit being disconnectable from a power supply using a mode signal;
    a second receiver circuit connected upstream from said second input, said second receiver circuit being disconnectable from the power supply using the mode signal; and
    a multiplex circuit having inputs;
    said output of said processing circuit and said connection being connected to said inputs of said multiplex circuit; and
    said multiplex circuit being controlled by a mode signal;
    said first input connected to said connection for receiving at least a first control clock signal derived from said control clock;
    said second input connected to said connection for receiving at least a second control clock signal derived from said control clock;
    said first control clock signal and said second control clock signal being shifted in phase with respect to one another;
    said output being configured to output a third clock signal generated from said first clock signal and said second clock signal;
    said third clock signal being at a higher frequency than a frequency of said control clock;
    said processing circuit being activated in a test mode of the integrated circuit for testing a functional capability of the integrated circuit;
    said third clock signal for controlling the integrated circuit in said test mode;
    said processing circuit being deactivated during normal operation of the integrated circuit; and
    said connection also being configured to connect to a further control clock for controlling the integrated circuit during the normal operation.

2. The integrated circuit according to claim 1, wherein in the test mode, said connection receives, from said externally applied control clock, said first control clock signal and said second control clock signal, which are not inverted with respect to one another.

3. The integrated circuit according to claim 1, wherein said processing circuit includes a logic circuit for logically combining said first clock signal and said second clock signal.

4. The integrated circuit according to claim 3, wherein said logic circuit is an XOR gate or an XNOR gate.

5. The integrated circuit according to claim 1, wherein said first control clock signal and said second control clock signal are shifted in phase with respect to one another by about 90° or by about a quarter of one period of said control clock.

6. A method for operating an integrated circuit, which comprises:
    providing the integrated circuit according to claim 1;
    for controlling the integrated circuit during the normal operation of the integrated circuit, applying the further control clock at a first frequency to said connection;
    in the test mode of the integrated circuit, applying the externally applied control clock at a second frequency to said connection, said second frequency being lower than said first frequency of said further control clock; and
    in the test mode, testing the functional capability of the integrated circuit and using said third clock signal to control the integrated circuit.

7. The method according to claim 6, which comprises, in the test mode, connecting said connection to a test unit that provides said second control clock.

8. In an integrated circuit having a normal operating mode and a test mode, a first control clock outputting a control clock signal at a frequency, a second control clock for operating the integrated circuit in the normal operating mode, a means for producing a first control clock signal from the control clock signal, and a means for producing a second control signal shifted in phase from the first control clock signal from the control clock signal; a processing circuit, comprising:

a first input receiving the first control clock signal;

a second input receiving the second control clock signal;

an output outputting a third clock signal generated from the first clock signal and the second clock signal at a higher frequency than the frequency of the control clock;

a first receiver circuit connected upstream from said first input, said first receiver circuit being disconnectable from a power supply using a mode signal;

a second receiver circuit connected upstream from said second input, said second receiver circuit being disconnectable from the power supply using the mode signal; and a multiplex circuit controlled by a mode circuit and having inputs connected respectively to said output of said processing circuit and said connection being connected to said inputs of said multiplex circuit and said first and said second clock units;

said processing circuit being activated in a test mode of the integrated circuit for testing a functional capability of the integrated circuit;

the third clock signal controlling the integrated circuit in the test mode; and the processing circuit being deactivated during the normal operating mode.

* * * * *